United States Patent [19]

Ono

[11] Patent Number: 5,293,073
[45] Date of Patent: Mar. 8, 1994

[54] ELECTRODE STRUCTURE OF A SEMICONDUCTOR DEVICE WHICH USES A COPPER WIRE AS A BONDING WIRE

[75] Inventor: Tadaaki Ono, Hyogo, Japan

[73] Assignee: Kabushiki Kaisha Toshiba, Kawasaki, Japan

[21] Appl. No.: 37,184

[22] Filed: Mar. 24, 1993

Related U.S. Application Data

[63] Continuation of Ser. No. 796,889, Nov. 25, 1991, abandoned, which is a continuation of Ser. No. 542,715, Jun. 25, 1990, abandoned.

[30] Foreign Application Priority Data

Jun. 27, 1989 [JP] Japan ................... 1-164533

[51] Int. Cl.$^5$ ............................... H01L 23/48
[52] U.S. Cl. ..................... 257/740; 257/635; 257/747; 257/750; 257/762; 257/780
[58] Field of Search .................. 357/71, 65, 54; 257/635, 740, 747, 750, 762, 780

[56] References Cited

U.S. PATENT DOCUMENTS

| | | | |
|---|---|---|---|
| 3,408,238 | 10/1968 | Sanders | 357/54 |
| 3,475,234 | 10/1969 | Kerwin et al. | 357/54 |
| 3,528,168 | 9/1970 | Apamic, Jr. | 357/54 |
| 3,887,407 | 6/1975 | Ono et al. | 357/54 |
| 4,060,828 | 11/1977 | Satonaka | 357/71 |
| 4,149,307 | 4/1979 | Henderson | 357/54 |
| 4,231,050 | 10/1980 | Casey, Jr. et al. | 357/54 |
| 4,507,673 | 3/1985 | Aoyama et al. | |
| 4,646,126 | 2/1987 | Iizuka | 357/71 |
| 4,796,084 | 1/1989 | Kamasaki et al. | 357/71 |

FOREIGN PATENT DOCUMENTS

| | | |
|---|---|---|
| 20271110 | 6/1988 | European Pat. Off. |
| 0328262 | 8/1989 | European Pat. Off. |
| 2092376 | 8/1982 | United Kingdom |

*Primary Examiner*—Edward Wojciechowicz
*Attorney, Agent, or Firm*—Finnegan, Henderson, Farabow, Garrett & Dunner

[57] ABSTRACT

A semiconductor device comprises a semiconductor substrate, a first insulation film formed on the semiconductor substrate, a metal film for forming a bonding pad on the first insulation film, and a second insulation film which is formed between the first insulation film and the bonding pad and which is stiffer than the first insulation film.

4 Claims, 2 Drawing Sheets

5,293,073

ELECTRODE STRUCTURE OF A SEMICONDUCTOR DEVICE WHICH USES A COPPER WIRE AS A BONDING WIRE

This application is a continuation of application Ser. No. 07/796,889, filed Nov. 25, 1991, now abandoned, which is a continuation of Ser. No. 07/542,715 filed Jun. 25, 1990, now abandoned.

BACKGROUND OF THE INVENTION

1. Field of the Invention

The present invention relates to an improvement in electrodes of a semiconductor device in which a copper type wire is used as a bonding wire.

2. Description of the Related Art

Generally, in a high-frequency semiconductor device, an integrated circuit and the like, an electrode is formed of aluminum. The aluminum allows a bonding pad to be formed on an oxide film on a silicon substrate.

FIG. 1 is a cross-sectional view showing a conventional semiconductor device.

In FIG. 1, element 13 having a PN junction, such as a transistor, is formed in the surface region of silicon substrate 11. Oxide film 12 is formed on silicon substrate 11 and has contact hole 14 for extracting an electrode. Aluminum electrode 15 is thus extracted through contact hole 14 and allows a bonding pad to be formed on oxide film 12.

The above-described configuration of the conventional semiconductor device has a drawback wherein a stress locally concentrates directly under the bonding pad.

As illustrated in FIG. 2, semiconductor chip 16 including the above-described configuration of the conventional semiconductor device is mounted on lead frame 17. Aluminum electrode 15 is thus connected to an external lead by copper type wire 18 made of copper, copper alloy or the like. Since the wire is stiff enough to be used as a bonding wire, aluminum electrode 15 is bent to be connected to the external lead. In the conventional semiconductor device, semiconductor chip 16 is greatly damaged and crack 19 is easy to occur in oxide film 12 directly under the bonding pad or even in silicon substrate 11 under oxide film 12.

If crack 19 occurs in oxide film 12, an insulation state cannot be maintained, and a leak or a short circuit is caused between electrodes.

SUMMARY OF THE INVENTION

It is accordingly an object of the present invention to provide a semiconductor device which prevents a stress from locally concentrating directly under a bonding pad to eliminate damage caused from bonding of a copper type wire.

To attain the above object, a semiconductor device according to one aspect of the present invention comprises:

a semiconductor substrate;

a first insulation film formed on a semiconductor substrate;

a metal film for forming a bonding pad on the first insulation film; and a second insulation film which is formed between the first insulation film and the bonding pad and which is stiffer than the first insulation film.

A semiconductor device according to another aspect of the present invention comprises:

a semiconductor substrate;

a first insulation film formed on the semiconductor substrate;

a metal film for forming a bonding pad on the first insulation film;

a second insulation film which is formed between the first insulation film and the bonding pad and which is stiffer than the first insulation film; and a bonding wire connected to the bonding pad.

A semiconductor device according to still another aspect of the present invention comprises:

a semiconductor substrate on which a semiconductor element is formed;

a first insulation film having a contact hole in a predetermined region thereof;

a metal film connected to the semiconductor element through the contact hole, for forming a bonding pad on the first insulation film; and a second insulation film which is formed between the first insulation film and the bonding pad and which is stiffer than the first insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
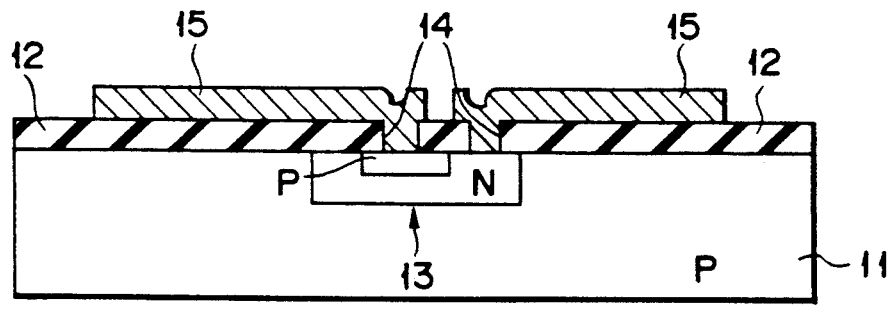
FIG. 1 is a cross-sectional view showing a conventional semiconductor device.
Figure 2:
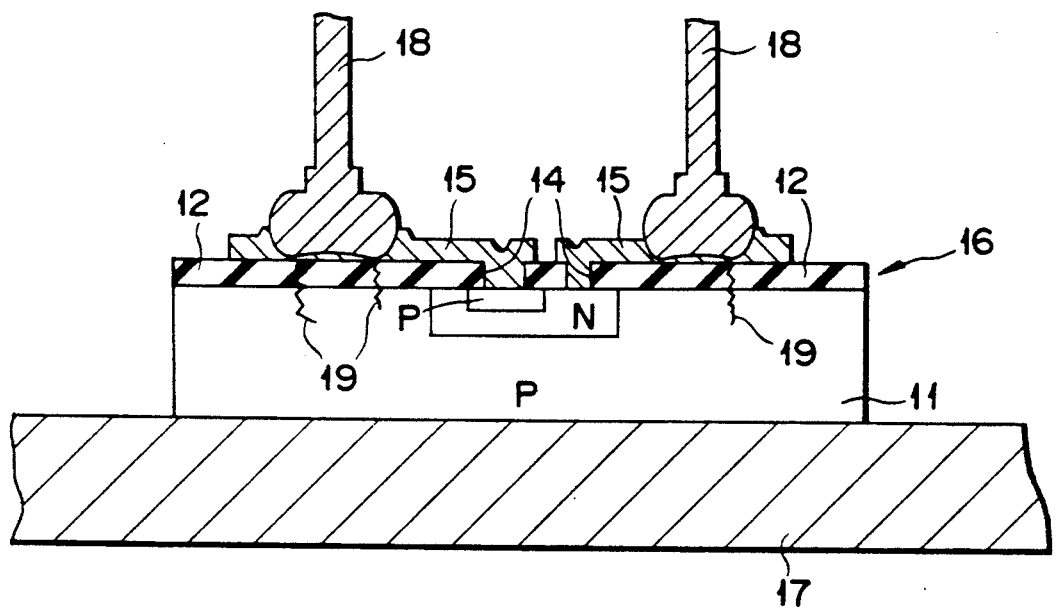
FIG. 2 is a cross-sectional view showing a semiconductor chip including the conventional semiconductor device shown in FIG. 1, in which a copper type wire is used as a bonding wire.

A semiconductor device according to an embodiment of the present invention will be described in detail with reference to the accompanying drawings. The elements common to all the drawings are denoted by the same reference numerals to avoid repeating the descriptions of the same elements.

Figure 3:
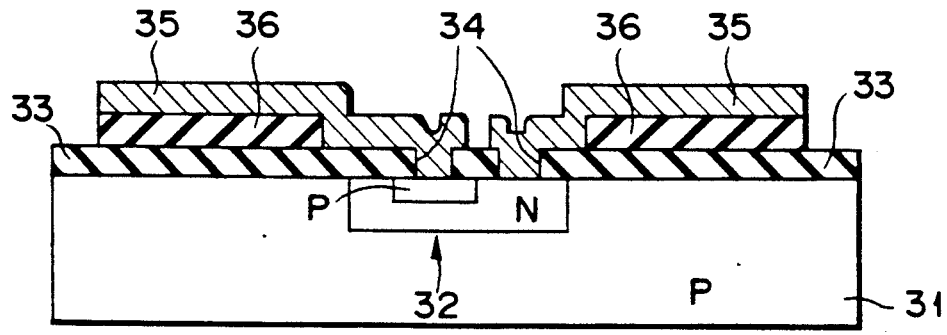
FIG. 3 is a cross-sectional view showing a semiconductor device according to an embodiment of the present invention.

FIG. 3 is a cross-sectional view showing a semiconductor device according to a embodiment of the present invention.

In FIG. 3, element 32 having a PN junction is formed in the surface region of silicon substrate 31. Oxide film (first insulation film) 33 such as an $SiO_2$ film is formed on silicon substrate 31. Contact hole 34 for extracting an electrode is formed in oxide film 33. Aluminum electrodes 35 is thus extracted through contact hole 34 and allows a bonding pad to be formed. Silicon compound 36 such as Si$_3$N$_4$ (second insulation film), which is stiffer than oxide film 33, is formed between the bonding pad and oxide film 33.

Figure 4:
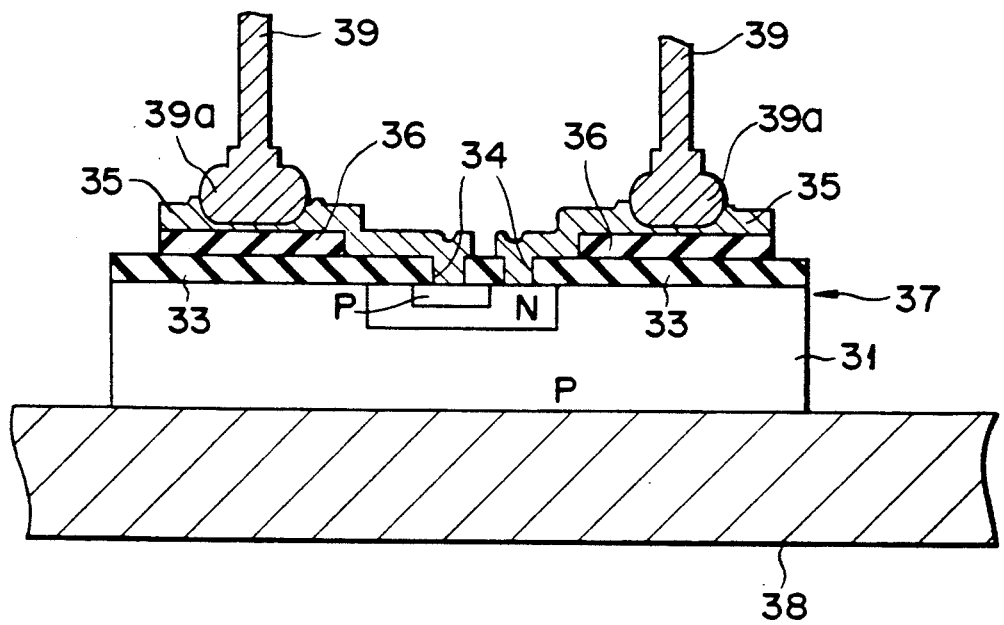
FIG. 4 is a cross-sectional view showing a semiconductor chip including the semiconductor device shown in FIG. 3, in which a copper type wire is used as a bonding wire.

FIG. 4 is a cross-sectional view showing a semiconductor chip including the semiconductor device shown in FIG. 3, in which a copper type wire is used as a bonding wire.

In FIG. 4, semiconductor chip 37 on which the semiconductor device shown in FIG. 3 is mounted on lead frame 38. Lead frame 38 is then heated at 200° to 450° C. and copper type wire 39 is bonded to the bonding pad of semiconductor chip 37 by thermocompression bonding or vibration (ultrasound).

When copper type wire 39 is bonded to the bonding pad, ball 39a of wire 39 and aluminum electrode 35 serving as a bonding pad are deformed, which causes a shock in a lower portion of the bonding pad. Since silicon compound 36, which is stiffer than oxide film 33, is formed directly under the bonding pad to which wire 39 is bonded, a stress can be prevented from locally concentrating directly under the bonding pad and thus a shock can be reduced.

Conventionally, 5 to 30 percent of manufactured semiconductor devices had defects of leakage and defects in withstand voltage as initial characteristics. In the present invention, the rate of semiconductor devices having such defects can be decreased below 0.01%. It is turned out from a high-temperature shelf test and a heat cycle test that the semiconductor device of the present invention has ten times as long duration of time as the conventional device has.

A method of manufacturing a semiconductor device according to the present invention will be described with reference to FIG. 3.

First, oxide film 33 is formed on silicon substrate 31 in which element 32 is formed, and contact hole 34 is formed in a predetermined region of oxide film 33. Silicon compound 36 is then deposited on oxide film 33 by the LPCVD method and is patterned by the PEP (photo etching process). After that, aluminum is deposited on silicon compound 36 and then patterned to form aluminum electrode 35 having a bonding pad.

To increase the step coverage of aluminum electrode 35, it is effective to form an oxide film on silicon compound 36 by the CVD method.

It is preferable that the thickness of silicon compound 36 formed directly under the bonding pad is within a range capable of obtaining an effect of reducing a shock caused by bonding of the bonding wire.

It silicon compound 36 is a nitride film, it is desirable that the thickness of the nitride film is at least 500 Å and it is the most effective that the thickness ranges from 1,000 to 3,000 Å.

In the above embodiment, a nitride film such as Si$_3$N$_4$ is used as compound 36 for reducing a shock formed directly under the bonding pad. Instead of the nitride film, a compound which is stiffer than oxide film 33 can be used. Even if a nitrogen compound such as SiON, carbide such as silicon carbide (SiC), or a silicon compound including both the nitrogen compound and the carbide, is used, the same effect can be obtained.

It is needless to say that the present invention can be applied to all semiconductor elements as well as transistors, diodes and IC elements.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor device comprising:
   a semiconductor substrate,
   a first insulation film formed to said semiconductor substrate;
   a metal film having a bonding pad portion formed above said first insulation film;
   a second insulation film, containing carbon, formed between said first insulation film and said bonding pad portion and being in contact with said first insulation film and said bonding pad portion, said second insulation film being formed only directly under said bonding pad portion, said second insulation film being stiffer than said first insulation film for preventing stress from locally concentrating under said bonding pad portion, and said second insulation film having a thickness between 500 and 3,000Å; and
   a bonding wire made of one of copper and an alloy containing copper connected to said bonding pad portion.

2. A semiconductor device according to claim 1, wherein said second insulation film is a silicon compound.

3. A semiconductor device comprising:
   a semiconductor substrate o which a semiconductor element is formed;
   a first insulation film having a contact hole in a predetermined region thereof;
   a metal film having a bonding pad portion formed above said first insulation film, said metal film being connected to said semiconductor element through said contact hole;
   a second insulation film, containing carbon, formed between said first insulation film and said bonding pad portion and being in contact with said first insulation film and said bonding pad portion, said second insulation film being formed only directly under said bonding pad portion, and said second insulation film being stiffer than said first insulation film to prevent stress from locally concentrating under said bonding pad portion; and
   a bonding wire made of one of copper and an alloy containing copper and connected to said bonding pad portion.

4. A semiconductor device according to claim 3, wherein said second insulation film is a silicon compound.

* * * * *